(12) United States Patent
Ozaki et al.

(10) Patent No.: US 10,964,805 B2
(45) Date of Patent: Mar. 30, 2021

(54) COMPOUND SEMICONDUCTOR DEVICE

(71) Applicant: FUJITSU LIMITED, Kawasaki (JP)

(72) Inventors: Shirou Ozaki, Yamato (JP); Kozo Makiyama, Kawasaki (JP); Yuichi Minoura, Machida (JP); Yusuke Kumazaki, Atsugi (JP); Toshihiro Ohki, Hadano (JP); Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 74 days.

(21) Appl. No.: 16/530,297

(22) Filed: Aug. 2, 2019

(65) Prior Publication Data

US 2020/0058783 A1 Feb. 20, 2020

(30) Foreign Application Priority Data

Aug. 16, 2018 (JP) .............................. JP2018-153225

(51) Int. Cl.
| | |
|---|---|
| *H01L 29/778* | (2006.01) |
| *H01L 29/66* | (2006.01) |
| *H01L 23/373* | (2006.01) |
| *H01L 29/20* | (2006.01) |

(52) U.S. Cl.
CPC ...... *H01L 29/7787* (2013.01); *H01L 23/3732* (2013.01); *H01L 29/66462* (2013.01); *H01L 29/2003* (2013.01)

(58) Field of Classification Search
CPC ........... H01L 29/7787; H01L 29/66462; H01L 23/3732; H01L 29/2003; H01L 2224/48472; H01L 2224/48247; H01L 2224/0603; H01L 2924/181; H01L 2224/48257; H01L 23/291; H01L 29/42376; H01L 29/41766; H01L 23/49562
See application file for complete search history.

(56) References Cited

U.S. PATENT DOCUMENTS

| | | | |
|---|---|---|---|
| 9,954,087 B2* | 4/2018 | Inoue | H01L 29/2003 |
| 10,283,632 B2* | 5/2019 | Tanaka | H01L 29/513 |
| 2007/0126026 A1 | 6/2007 | Ueno et al. | |
| 2013/0264657 A1* | 10/2013 | Komatani | H01L 29/7787 257/402 |

FOREIGN PATENT DOCUMENTS

| | | |
|---|---|---|
| JP | H11-163334 A | 6/1999 |
| JP | 2007-157829 A | 6/2007 |
| JP | 2008-103705 A | 5/2008 |

* cited by examiner

*Primary Examiner* — Karen Kusumakar
(74) *Attorney, Agent, or Firm* — Fujitsu Patent Center

(57) ABSTRACT

A compound semiconductor device includes a compound semiconductor laminate structure including an electron transit layer and an electron supply layer, a gate electrode, a source electrode, and a drain electrode that are formed over the electron supply layer, a first insulating layer of diamond formed between the gate electrode and the drain electrode over the compound semiconductor laminate structure, and a second insulating layer formed between the gate electrode and the source electrode over the compound semiconductor laminate structure, wherein a positive compressive stress is applied from the first insulating layer to the electron supply layer, and a compressive stress from the second insulating layer to the electron supply layer is smaller than the compressive stress from the first insulating layer to the electron supply layer.

11 Claims, 14 Drawing Sheets

US 10,964,805 B2

1
COMPOUND SEMICONDUCTOR DEVICE

CROSS-REFERENCE TO RELATED APPLICATION

This application is based upon and claims the benefit of priority of the prior Japanese Patent Application No. 2018-153225, filed on Aug. 16, 2018, the entire contents of which are incorporated herein by reference.

FIELD

The embodiments discussed herein are related to compound semiconductor technology.

BACKGROUND

Nitride semiconductors GaN, AlN, InN, and the like and materials of mixed crystals thereof have wide band gaps, and are used for high-output electronic devices and short-wavelength light-emitting devices. Among these, for high-output electronic devices, technology related to field-effect transistors (FETs), particularly high electron mobility transistors (HEMTs), is developed.

Examples of field-effect transistors including nitride semiconductor include GaN-based HEMTs including an electron transit layer of GaN and an electron supply layer of AlGaN, and a two-dimensional electron gas (2DEG) of high concentration is generated in the electron transit layer as an effect of piezoelectric polarization and spontaneous polarization in GaN. Therefore, application for high-output amplifiers is expected for GaN-based HEMTs.

As the output increases, an HEMT becomes more likely to generate heat. Therefore, a structure in which a diamond layer is provided on the surface of the HEMT is proposed to dissipate the heat generated by the HEMT to the outside.

Related art is disclosed in, for example, Japanese Laid-open Patent Publication Nos. 11-163334, 2008-103705, and 2007-157829.

SUMMARY

According to an aspect of the embodiments, a compound semiconductor device includes a compound semiconductor laminate structure including an electron transit layer and an electron supply layer, a gate electrode, a source electrode, and a drain electrode that are formed over the electron supply layer, a first insulating layer of diamond formed between the gate electrode and the drain electrode over the compound semiconductor laminate structure, and a second insulating layer formed between the gate electrode and the source electrode over the compound semiconductor laminate structure, wherein a positive compressive stress is applied from the first insulating layer to the electron supply layer, and a compressive stress from the second insulating layer to the electron supply layer is smaller than the compressive stress from the first insulating layer to the electron supply layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Although a compound semiconductor device including a diamond layer on the surface of an HEMT according to the related art has an excellent heat dissipating property, sufficient output current may not be obtained therefrom.

Hereinafter, embodiments of the present disclosure will be described in detail with reference to accompanying drawings. In the specification and drawings, constituent elements having substantially the same functional configuration may be described with the same reference signs and the overlapping description thereof may be omitted.

Figure 1:
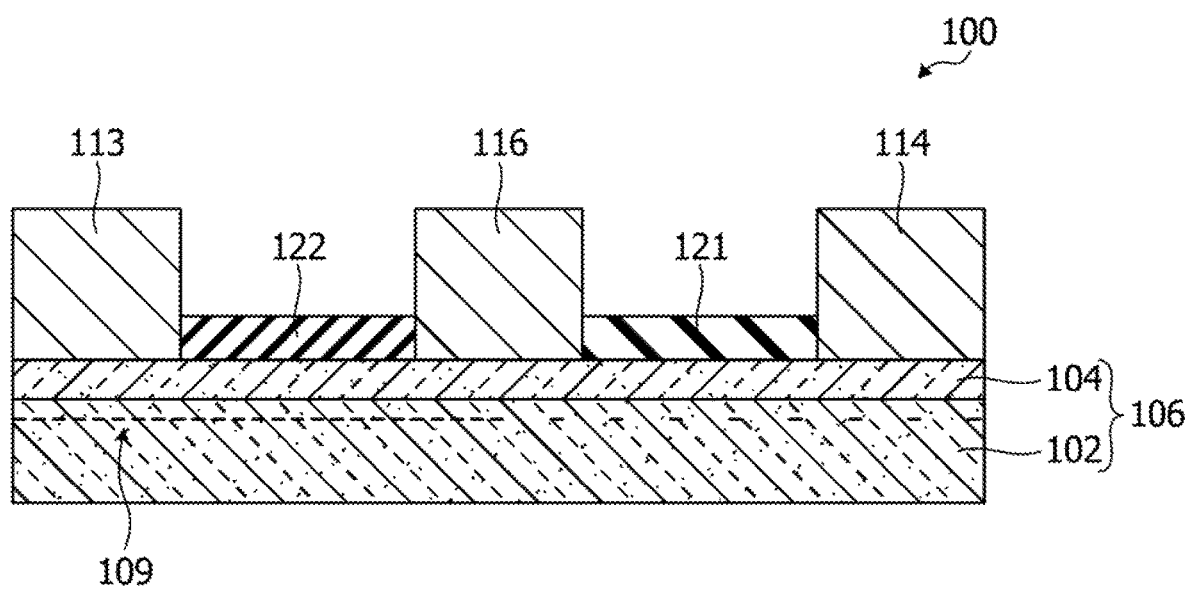
FIG. 1 is a section view of a compound semiconductor device according to a first embodiment.

First, a first embodiment will be described below. FIG. 1 is a section view of a compound semiconductor device according to the first embodiment.

As illustrated in FIG. 1, a compound semiconductor device 100 according to the first embodiment includes a semiconductor laminate structure 106 including an electron transit layer 102 and an electron supply layer 104 that are formed from compound semiconductor. The compound semiconductor device 100 includes a gate electrode 116, a source electrode 113, and a drain electrode 114 above the electron supply layer 104. The compound semiconductor device 100 includes a first insulating layer 121 and a second insulating layer 122 that are formed on the semiconductor laminate structure 106. The first insulating layer 121 is formed from diamond and formed between the gate electrode 116 and the drain electrode 114. The second insulating layer 122 is formed between the gate electrode 116 and the source electrode 113. Positive compressive stress is applied from the first insulating layer 121 to the electron supply layer 104, and compressive stress applied from the second insulating layer 122 to the electron supply layer 104 is smaller than the compressive stress applied from the first insulating layer 121 to the electron supply layer 104. In the case where the stress applied from the second insulating layer 122 to the electron supply layer 104 is positive tensile stress, this stress is negative compressive stress.

In the compound semiconductor device 100, the first insulating layer 121 of diamond is formed between the gate electrode 116 and the drain electrode 114 on the semiconductor laminate structure 106, which may lead to an excellent heat dissipating property. Positive compressive stress is applied from the first insulating layer 121 to the electron supply layer 104, and the compressive stress applied from the second insulating layer 122 to the electron supply layer 104 is smaller than the compressive stress applied from the first insulating layer 121 to the electron supply layer 104. Therefore, even in the case where the concentration of a two-dimensional electron gas (2DEG) 109 is low below the first insulating layer 121 of diamond, the 2DEG 109 of a sufficient concentration is generated below the second insulating layer 122. Accordingly, the output current may be improved as compared with the structure in which a diamond layer is also formed between the gate electrode 116 and the source electrode 113 on the semiconductor laminate structure 106. As a result of the concentration of the 2DEG 109 being low below the first insulating layer 121, concentration of electric field that is likely to occur on the drain electrode 114 side of the gate electrode 116 may be suppressed, and thus pressure resistance may be improved.

Next, a method for manufacturing the compound semiconductor device 100 according to the first embodiment will be described. FIGS. 2A to 2D are each a section view of the compound semiconductor device 100 according to the first embodiment illustrating a manufacturing method thereof.

Figure 2A:
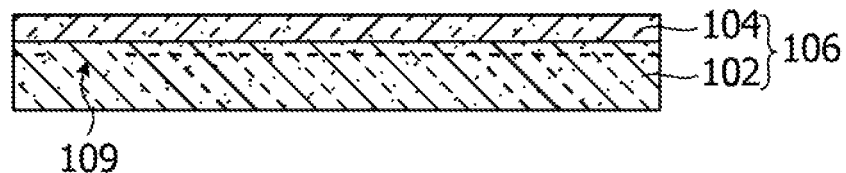
FIGS. 2A to 2D are each a section view of the compound semiconductor device according to the first embodiment illustrating a manufacturing method thereof.
Figure 2B:
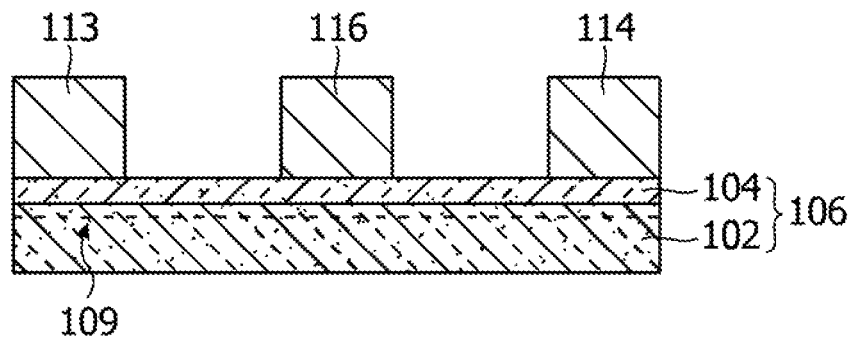
Figure 2C:
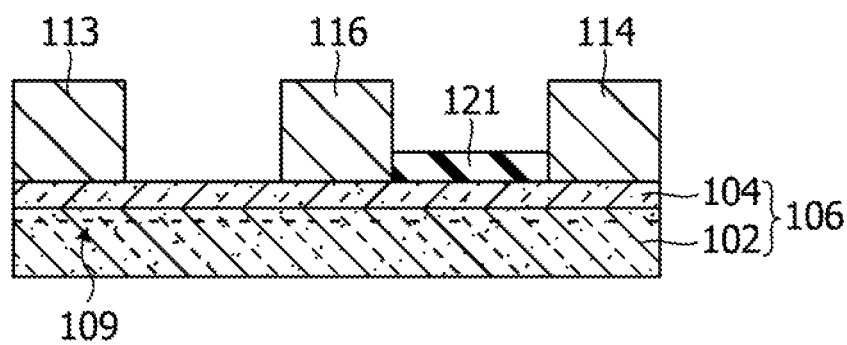
Figure 2D:
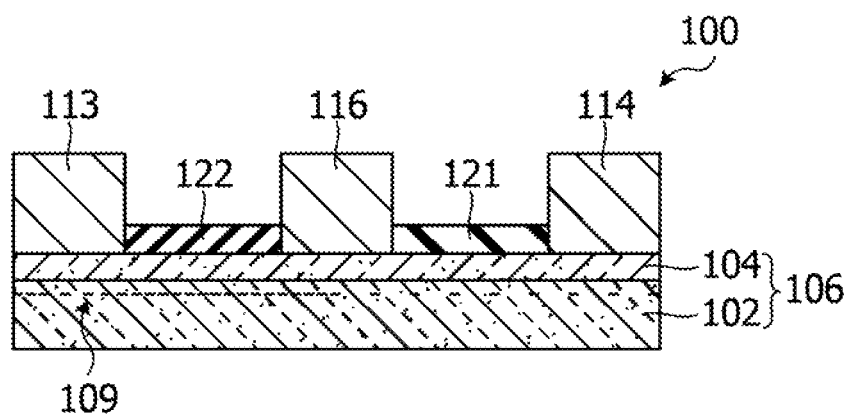

As illustrated in FIG. 2A, the semiconductor laminate structure 106 including the electron transit layer 102 and the electron supply layer 104 of compound semiconductor is formed. As illustrated in FIG. 2B, the gate electrode 116, the source electrode 113, and the drain electrode 114 are formed above the electron supply layer 104. As illustrated in FIG. 2C, the first insulating layer 121 of diamond is formed between the gate electrode 116 and the drain electrode 114 on the semiconductor laminate structure 106. As illustrated in FIG. 2D, the second insulating layer 122 is formed between the gate electrode 116 and the source electrode 113 on the semiconductor laminate structure 106.

In this manner, the compound semiconductor device 100 according to the first embodiment may be manufactured. The order of FIGS. 2A to 2D does not represent the order of manufacturing steps. For example, the second insulating layer 122 may be formed before forming the first insulating layer 121. For example, the gate electrode 116 may be formed after forming the source electrode 113 and the drain electrode 114. For example, the first insulating layer 121 and the second insulating layer 122 may be formed before forming the gate electrode 116.

Figure 3:
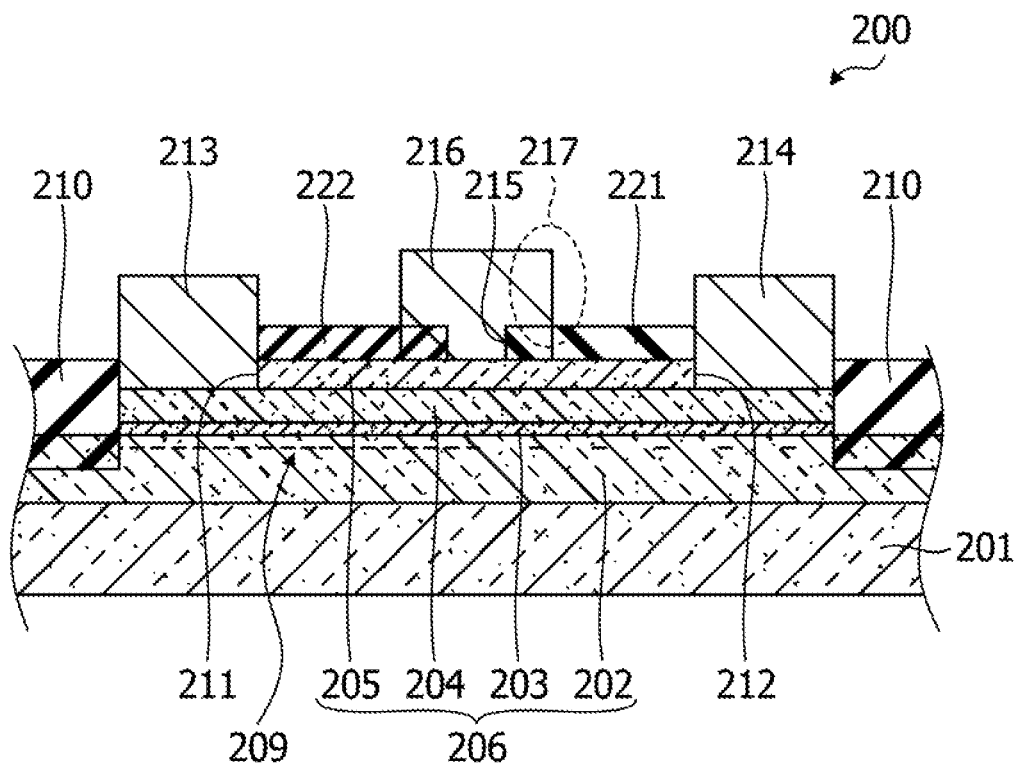
FIG. 3 is a section view of a compound semiconductor device according to a second embodiment.

Next, a second embodiment will be described. The second embodiment relates to a compound semiconductor device including a GaN-based HEMT. FIG. 3 is a section view of a compound semiconductor device according to the second embodiment.

A compound semiconductor device 200 according to the second embodiment includes a semiconductor laminate structure 206 formed on a substrate 201 as illustrated in FIG. 3. The semiconductor laminate structure 206 includes, for example, an electron transit layer 202, a spacer layer 203, an electron supply layer 204, and a cap layer 205 that are formed from compound semiconductor. The electron transit layer 202 is, for example, a GaN layer (i-GaN layer) having a thickness of 2 μm to 4 μm and not having undergone intentional doping with impurities. The spacer layer 203 is, for example, an AlGaN layer (i-AlGaN layer) having a thickness of 4 nm to 6 nm and not having undergone intentional doping with impurities. The electron supply layer 204 is, for example, an n-type AlGaN layer (n-AlGaN layer) having a thickness of 25 nm to 35 nm. The cap layer 205 is, for example, an AlN layer having a thickness of 1 nm to 10 nm. The electron supply layer 204 is, for example, doped with Si at a concentration of about $5 \times 10^{18}$ cm$^{-3}$. The semiconductor laminate structure 206 may include a buffer layer of AlGaN or the like between the electron transit layer 202 and the substrate 201.

An element separation region 210 that defines an element region is formed in the semiconductor laminate structure 206. In the element region, opening portions 211 and 212 are defined in the cap layer 205. A source electrode 213 is formed in the opening portion 211, and a drain electrode 214 is formed in the opening portion 212. A first insulating layer 221 of diamond and a second insulating layer 222 of aluminum oxide ($Al_2O_3$) or silicon nitride ($Si_3N_4$) are formed on the cap layer 205. A gap 215 is provided between the first insulating layer 221 and the second insulating layer 222. The first insulating layer 221 is provided on the drain electrode 214 side of the gap 215, and the second insulating layer 222 is provided on the source electrode 213 side of the gap 215. The first insulating layer 221 is, for example, a diamond layer having a thickness of 10 nm to 1000 nm. The second insulating layer 222 is, for example, an oxide aluminum layer or a silicon nitride layer having a thickness of 10 nm to 100 nm. A gate electrode 216 in Schottky contact with the cap layer 205 via the gap 215 is formed. That is, the first insulating layer 221 of diamond is formed between the gate electrode 216 and the drain electrode 214 on the cap layer 205, and the second insulating layer 222 is formed between the gate electrode 216 and the source electrode 213 on the cap layer 205. The gate electrode 216 has a so-called T-shape structure, and includes a field plate portion 217 having an overhanging shape in contact with the top surface of the first insulating layer 221.

In the compound semiconductor device 200, the first insulating layer 221 of diamond is formed between the gate electrode 216 and the drain electrode 214 on the cap layer 205, which may lead to an excellent heat dissipating property. The thermal conductivity (about 319 W/m·K) of aluminum nitride (AlN) is much higher than the thermal conductivity (220 W/m·K) of gallium nitride (GaN) and the thermal conductivity (about 3 W/m·K) of silicon nitride ($Si_3N_4$). Therefore, the compound semiconductor device 200 including the cap layer 205 of AlN may transmit heat generated in the vicinity of the gate electrode 216 to the first insulating layer 221 more efficiently than a structure including a cap layer of GaN or $Si_3N_4$.

The lattice constant of diamond making up the first insulating layer 221 is smaller than the lattice constant of AlGaN making up the electron supply layer 204. Therefore, positive compressive stress is applied from the first insulating layer 221 to the electron supply layer 204, and thus the concentration of the 2DEG 209 in the channel between the gate electrode 216 and the drain electrode 214 is low as compared with a structure not including the first insulating layer 221. Therefore, concentration of electric field that is likely to occur on the drain electrode 214 side of the gate electrode 216 may be suppressed, and thus pressure resistance may be improved.

Further, the second insulating layer 222 of aluminum oxide or silicon nitride is formed between the gate electrode 216 and the source electrode 213 on the cap layer 205. The lattice constant of aluminum oxide and the lattice constant of silicon nitride are larger than the lattice constant of AlGaN making up the electron supply layer 204. Therefore, positive tensile stress, that is, negative compressive stress is applied from the second insulating layer 222 to the electron supply layer 204, and thus the concentration of the 2DEG 209 in the channel between the gate electrode 216 and the source electrode 213 is very high as compared with a structure including a diamond layer instead of the second insulating layer 222. Therefore, in the compound semiconductor device 200, the transconductance gm may be increased, the on-resistance may be decreased, and a large output current may be obtained.

As described above, in the second embodiment, the concentration of the 2DEG 209 in the channel between the gate electrode 216 and the drain electrode 214 (first concentration D1) is lower than the concentration of the 2DEG 209 in the channel between the gate electrode 216 and the source electrode 213 (second concentration D2).

According to the second embodiment, heat generated in the vicinity of the gate electrode 216 may be efficiently dissipated to the outside mainly through the cap layer 205 and the first insulating layer 221. In the case where a diamond layer is formed also between the source electrode 213 and the gate electrode 216, the concentration of the 2DEG 209 thereunder is low, and a sufficient output current may not be obtained. In contrast, according to the second embodiment, as an effect of the second insulating layer 222, the concentration of the 2DEG 209 thereunder is increased, and a large output current may be obtained. Further, since the concentration of the 2DEG 209 on the drain electrode 214 side of the gate electrode 216 is low, concentration of electric field may be suppressed, and thus excellent pressure resistance may be achieved.

Since the gate electrode 216 includes the field plate portion 217, the concentration of electric field may be also suppressed by the field plate portion 217, and thus excellent pressure resistance may be achieved.

$In_xAl_{1-x}N$ (0<x<0.5) or $In_xAl_{1-x-y}Ga_yN$ (0<x<0.5, 0<y<0.5, x+y<0.5) may be used for the cap layer 205 instead of AlN.

Next, a method for manufacturing the compound semiconductor device 200 according to the second embodiment will be described. FIGS. 4A to 4H are each a section view of the compound semiconductor device 200 according to the second embodiment illustrating a manufacturing method thereof.

Figure 4A:
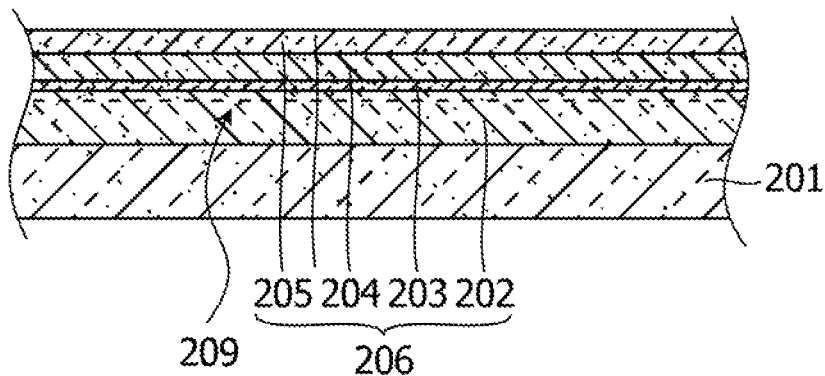
FIGS. 4A to 4H are each a section view of the compound semiconductor device according to the second embodiment illustrating a manufacturing method thereof.
Figure 4B:
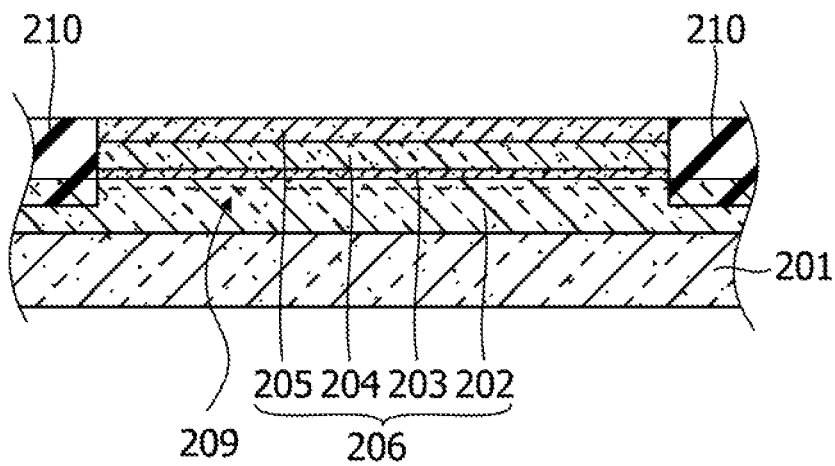

First, as illustrated in FIG. 4A, the semiconductor laminate structure 206 including the electron transit layer 202, the spacer layer 203, the electron supply layer 204, and the cap layer 205 is formed on the substrate 201. The semiconductor laminate structure 206 may be formed by, for example, the metal organic vapor phase epitaxy (MOVPE) method. As a result of this, the 2DEG 209 is generated in the vicinity of the surface of the electron transit layer 202 at a third concentration D3 higher than the first concentration D1 and lower than the second concentration D2.

For the formation of the semiconductor laminate structure 206, for example, a mixed gas of trimethylaluminum (TMA) gas serving as an Al source, a trimethylgallium (TMG) gas serving as a Ga source, and an ammonia ($NH_3$) gas serving as a N source is used. At this time, whether or not to supply the trimethylaluminum gas and the trimethylgallium gas and the flow rate thereof are appropriately set in accordance with the composition of the compound semiconductor layer to be grown. The flow rate of the ammonia gas that is a raw material common for each compound semiconductor layer is, for example, about 100 ccm to 10 LM. For example, the growth pressure is about 50 Torr to 300 Torr, and the growth temperature is about 1000° C. to 1200° C. When growing an n-type compound semiconductor layer (for example, the electron supply layer 204), for example, a $SIH_4$ gas containing Si is added to the mixed gas at a predetermined flow rate, and thus the compound semiconductor layer is doped with Si. The doping concentration of Si is, for example, about $1\times10^{18}$ $cm^{-3}$ to $1\times10^{20}$ $cm^{-3}$.

Next, as illustrated in FIG. 46, the element separation region 210 defining the element region is formed in the semiconductor laminate structure 206. In the formation of the element separation region 210, for example, a photoresist pattern that exposes a region where the element separation region 210 is to be formed is formed on the cap layer 205, and ion injection of Ar or the like is performed by using this pattern as a mask. Dry etching may be performed with a chlorine-based gas by using this pattern as an etching mask. The 2DEG 209 is not present in the element separation region 210.

Figure 4C:
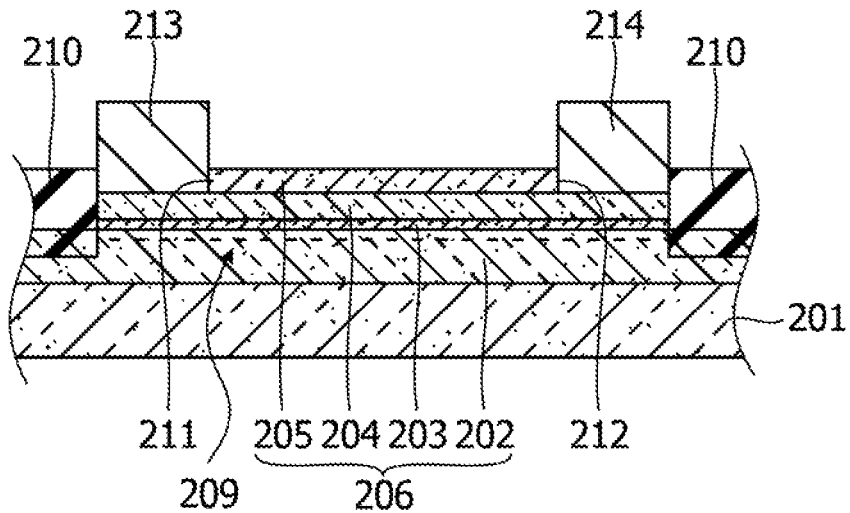

Then, as illustrated in FIG. 4C, the opening portions 211 and 212 are defined in the cap layer 205, the source electrode 213 is formed in the opening portion 211, and the drain electrode 214 is formed in the opening portion 212. For example, the opening portions 211 and 212 may be defined by providing, by photolithography technology, a resist film having opening portions respectively in regions where the source electrode 213 and the drain electrode 214 are to be formed, and performing dry etching by using a chlorine-based gas. Further, for example, the source electrode 213 and the drain electrode 214 may be formed inside the opening portions of the resist film by forming a metal film by a vapor deposition method using this resist film as a growth mask and removing the resist film together with the metal film thereon. That is, the source electrode 213 and the drain electrode 214 may be formed by a lift-off method. In the formation of the metal film, for example, an Al film is formed after forming a Ti film. After removing the resist film, for example, heat treatment is performed at 400° C. to 1000° C. in a nitrogen atmosphere to establish the ohmic characteristics.

Figure 4D:
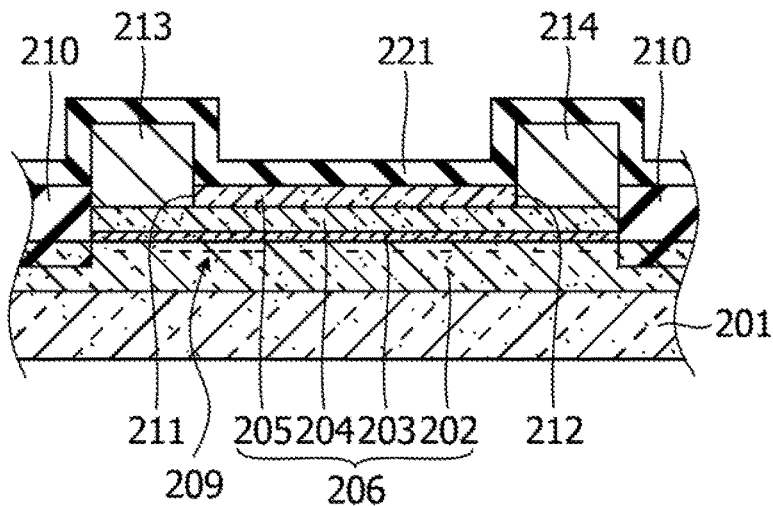

Next, as illustrated in FIG. 4D, the first insulating layer 221 is formed on the cap layer 205. In the formation of the first insulating layer 221, for example, diamond powder is placed on the cap layer 205 as a diamond material, and a polycrystalline diamond layer is formed by the chemical vapor deposition (CVD) method. As a result, the concentration of the 2DEG 209 decreases to the first concentration D1. For example, the formation temperature of the polycrystalline diamond layer is 600° C. to 900° C., and is preferably 600° C. to 700° C. For example, methane ($CH_4$) and hydrogen ($H_2$) are used as raw materials of the polycrystalline diamond.

Figure 4E:
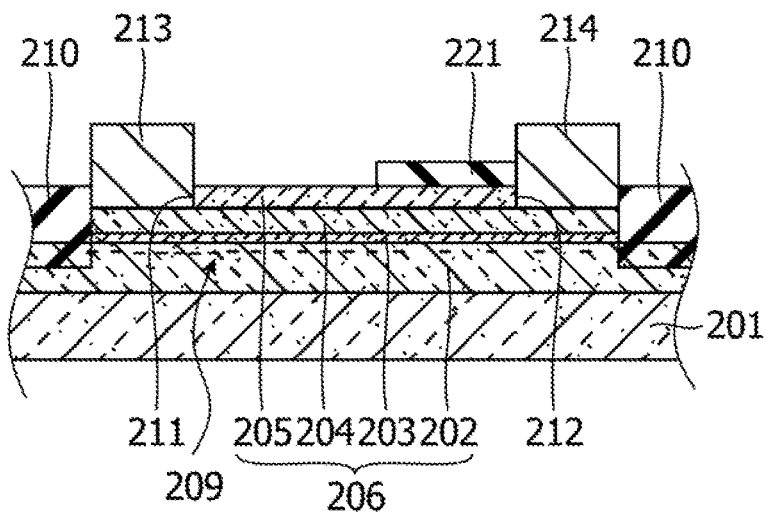

Next, as illustrated in FIG. 4E, the first insulating layer 221 is processed into a predetermined shape. In this processing, for example, a resist film having an opening portion at a region from which the first insulating layer 221 is to be removed may be provided by photolithography technology, and dry etching may be performed by using an oxygen gas. As a result, the concentration of the 2DEG 209 increases to the third concentration D3 in a region further on the source electrode 213 side than the first insulating layer 221 in plan view.

Figure 4F:
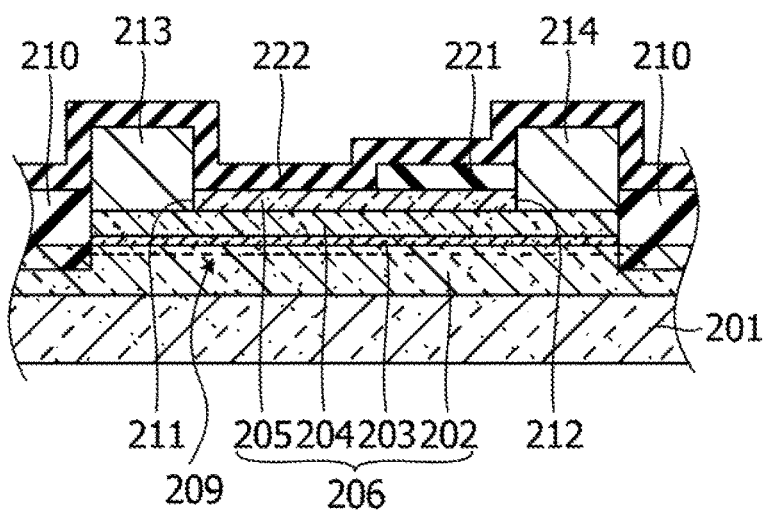

Then, as illustrated in FIG. 4F, the second insulating layer 222 is formed on the cap layer 205 and the first insulating layer 221. In the formation of the second insulating layer 222, for example, an aluminum oxide layer or a silicon nitride layer is formed by the atomic layer deposition (ALD) method. As a result, the concentration of the 2DEG 209 increases to the second concentration D2 in a region further on the source electrode 213 side than the first insulating layer 221 in plan view, and the concentration of the 2DEG 209 increases to a fourth concentration D4 lower than the second concentration D2 in a region where the first insulating layer 221 remains.

Figure 4G:
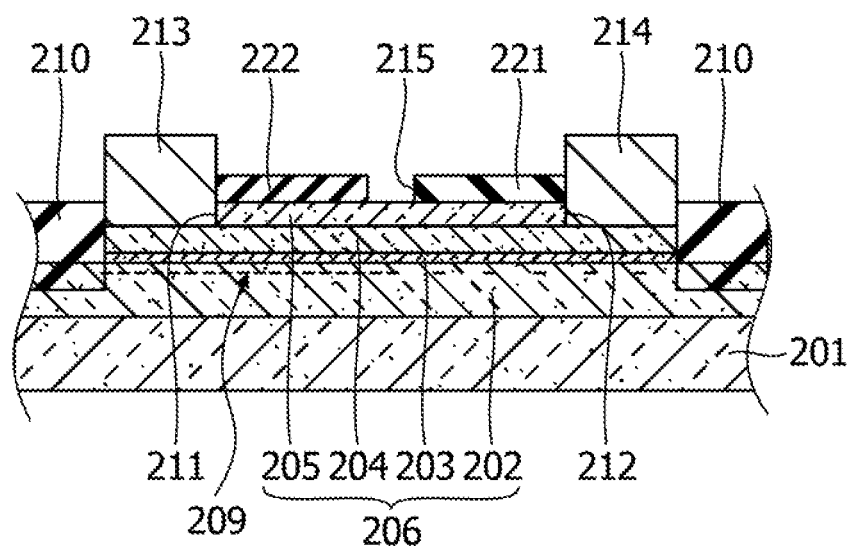

Next, as illustrated in FIG. 4G, the second insulating layer 222 is processed into a predetermined shape. In this processing, for example, a resist layer having an opening portion in a region from which the second insulating layer 222 is to be removed may be provided by photolithography technology, and wet etching may be performed by using tetramethylammonium hydroxide (TMAH). As a result, the gap 215 is provided between the first insulating layer 221 and the second insulating layer 222 on the cap layer 205. In the region where the first insulating layer 221 remains, the concentration of the 2DEG 209 decreases to the first concentration D1.

Figure 4H:
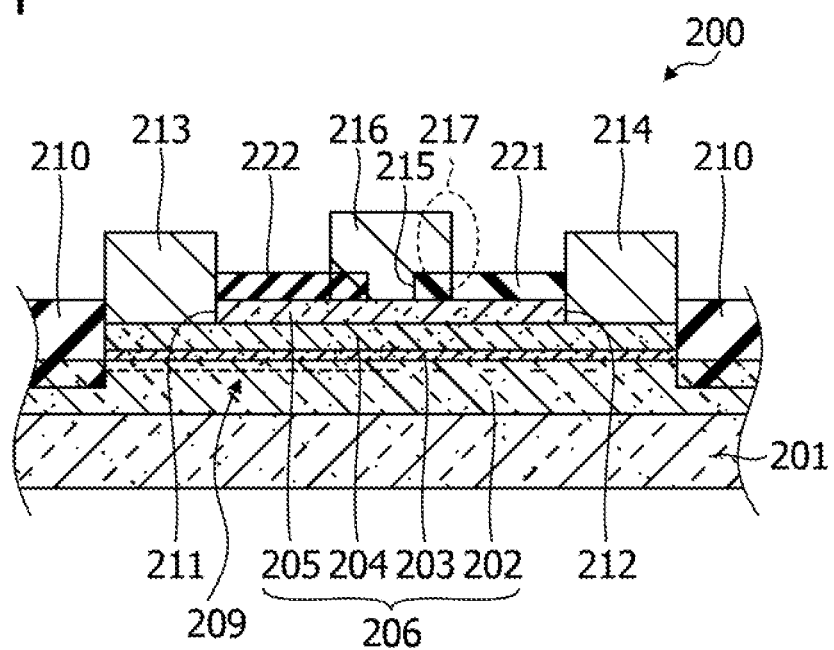

Next, as illustrated in FIG. 4H, the gate electrode 216 in Schottky contact with the cap layer 205 via the gap 215 and including the field plate portion 217 is formed. In the formation of the gate electrode 216, for example, a resist film having an opening portion in a region where the gate electrode 216 is to be formed is provided by photolithography technology. Then, the gate electrode 216 may be formed inside the opening portion of the resist film by forming a metal film by a vapor deposition method using this resist film as a growth mask and removing the resist film together with the metal film thereon. That is, the gate electrode 216 may be formed by a lift-off method. In the formation of the metal film, for example, an Au film is formed after forming an Ni film.

Then, protective films and wiring are formed if necessary, and thus the compound semiconductor device is completed.

As described above, for example, a polycrystalline diamond layer is formed as the first insulating layer 221 at a temperature of 600° C. to 900° C. by using methane and hydrogen. In the case of forming the first insulating layer 221 in such a condition, the surface of the cap layer 205 is likely to be etched when the cap layer 205 is a GaN layer. In contrast, in the case where the cap layer 205 is an AlN layer, the surface of the cap layer 205 is not likely to be etched. Therefore, an AlN layer is preferably formed as the cap layer 205. An $In_xAl_{1-x}N$ (0<x<0.5) or an $In_xAl_{1-x-y}Ga_yN$ (0<x<0.5, 0<y<0.5, x+y<0.5) may be formed instead of the AlN layer.

The concentration of the 2DEG 209 continuously changes in accordance with the intensity of deformation or the like. For example, the concentration does not change stepwise among the concentrations D1 to D4 described above, and the concentration of the 2DEG 209 changes continuously between adjacent regions. The same also applies to the embodiments below.

Figure 5:
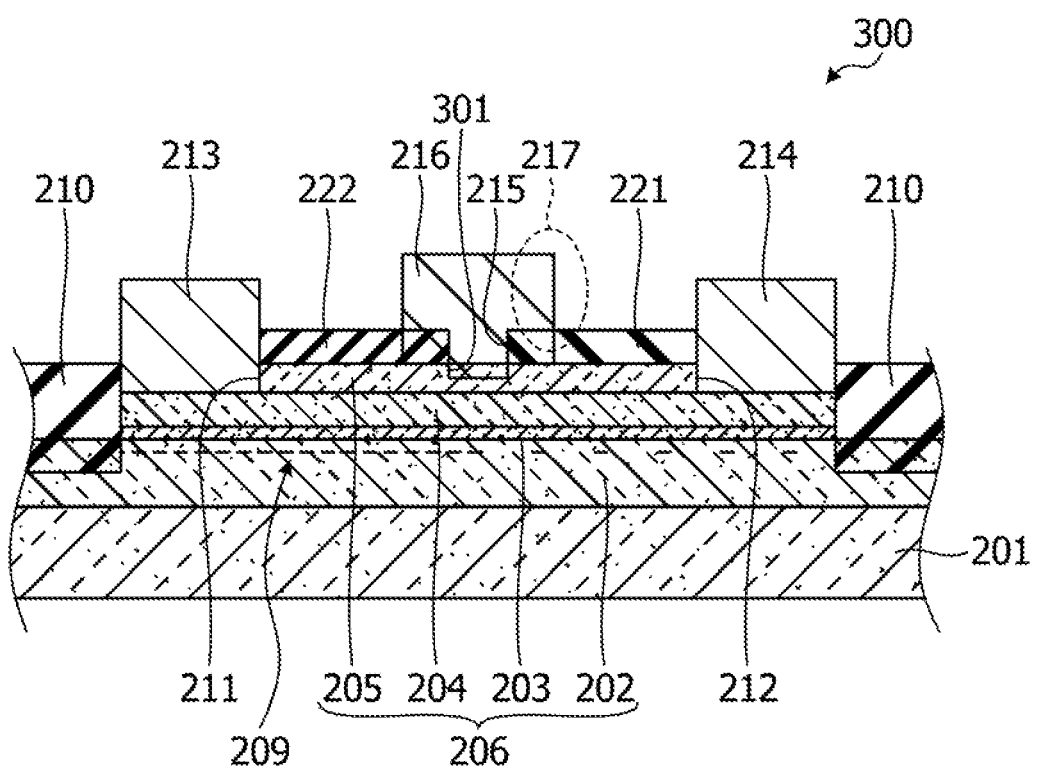
FIG. 5 is a section view of a compound semiconductor device according to a third embodiment.

Next, a third embodiment will be described. The third embodiment relates to a compound semiconductor device including a GaN-based HEMT. FIG. 5 is a section view of a compound semiconductor device according to the third embodiment.

As illustrated in FIG. 5, in a compound semiconductor device 300 according to the third embodiment, a gate recess 301 overlapping with the gap 215 in plan view is defined in the cap layer 205. The gate electrode 216 is formed to be also present in the gate recess 301. The other elements of the configuration are the same as in the second embodiment.

An effect similar to that of the second embodiment may be also achieved according to the third embodiment. As compared with the second embodiment, the distance between the lower end of the gate electrode 216 and the 2DEG 209 is shorter, and therefore better high-frequency characteristics may be achieved.

Figure 6A:
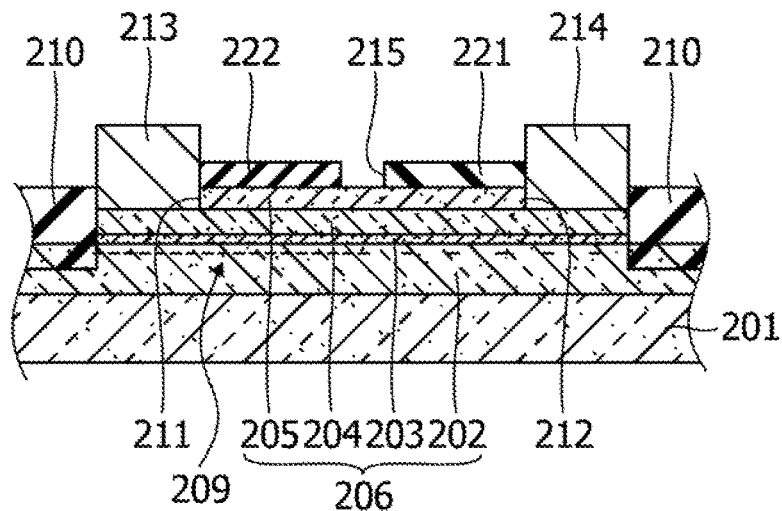
FIGS. 6A to 6C are each a section view of the compound semiconductor device according to the third embodiment illustrating a manufacturing method thereof.
Figure 6B:
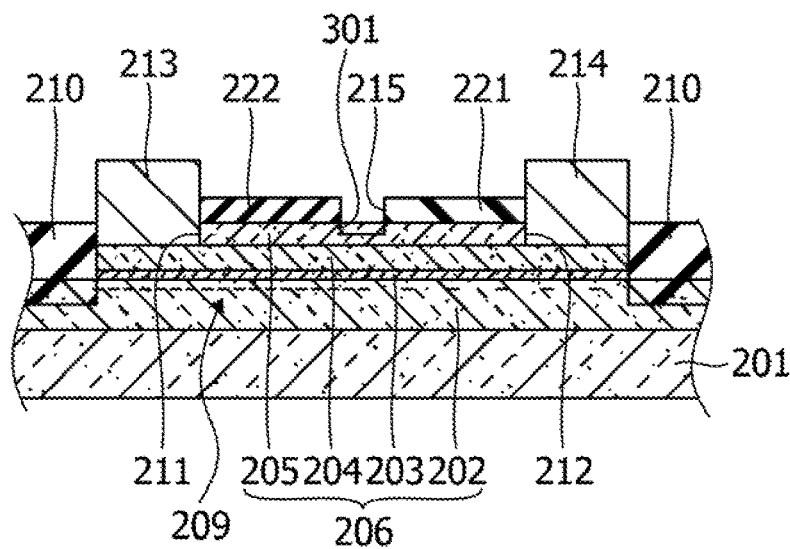
Figure 6C:
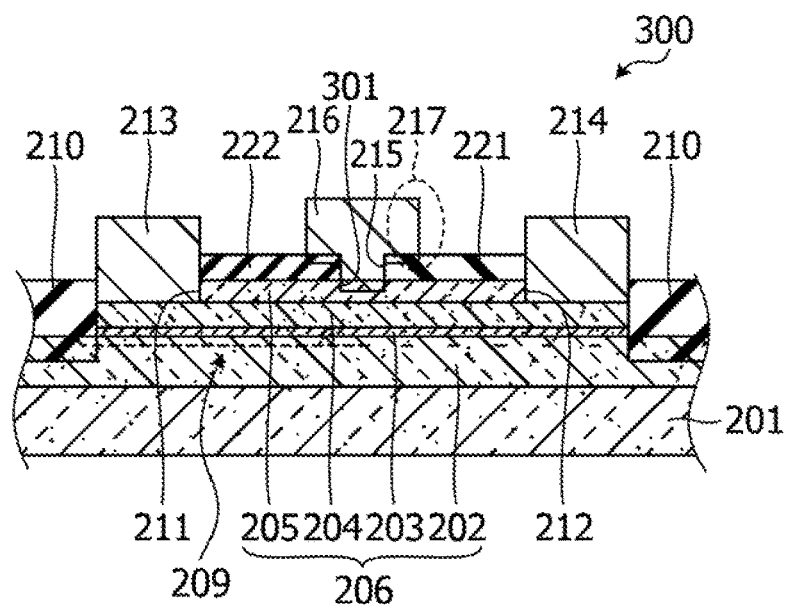

Next, a method for manufacturing the compound semiconductor device 300 according to the third embodiment will be described. FIGS. 6A to 6C are each a section view of the compound semiconductor device 300 according to the third embodiment illustrating a manufacturing method thereof.

First, as illustrated in FIG. 6A, processing up to the processing of the second insulating layer 222 (FIG. 4G) is performed in a similar manner to the method for manufacturing the compound semiconductor device 200.

Next, as illustrated in FIG. 68, the gate recess 301 overlapping with the gap 215 in plan view is defined in the cap layer 205 by, for example, dry etching using a chlorine-based gas (such as $Cl_2$ or $BCl_3$).

Then, as illustrated in FIG. 6C, the gate electrode 216 is formed in a similar manner to the method for manufacturing the compound semiconductor device 200.

Then, protective films and wiring are formed if necessary, and thus the compound semiconductor device is completed.

The gate recess 301 may be defined before forming the first insulating layer 221 and the second insulating layer 222.

In addition, the gate recess 301 may be defined so as to penetrate through the cap layer 205. In this case, the gate electrode 216 is also in contact with the electron supply layer 204.

Figure 7:
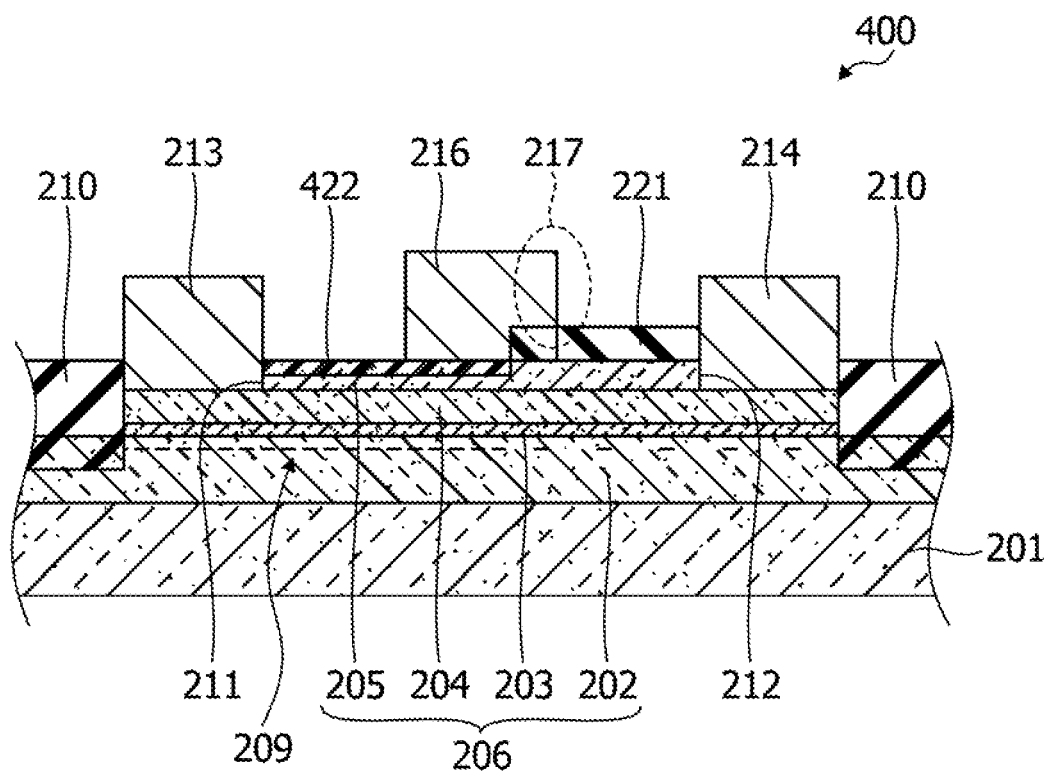
FIG. 7 is a section view of a compound semiconductor device according to a fourth embodiment.

Next, a fourth embodiment will be described. The fourth embodiment relates to a compound semiconductor device including a GaN-based HEMT. FIG. 7 is a section view of a compound semiconductor device according to the fourth embodiment.

As illustrated in FIG. 7, a compound semiconductor device 400 according to the fourth embodiment includes a second insulating layer 422 instead of the second insulating layer 222. The second insulating layer 422 is, for example, an aluminum oxide layer formed on the surface of the cap layer 205 and having a thickness of 0.5 nm to 5 nm. The second insulating layer 422 is formed so as to extend to an end portion on the source electrode 213 side of the first insulating layer 221 in plan view. The lower end of the gate electrode 216 is in contact not with the cap layer 205 but with the second insulating layer 422. A part of the second insulating layer 422 that overlaps with the gate electrode 216 in plan view functions as a gate insulating film. The other elements of the configuration are the same as in the second embodiment.

An effect similar to that of the second embodiment may be also achieved according to the fourth embodiment. In addition, as will be described later, the manufacturing time may be shortened as compared with the second embodiment.

Figure 8A:
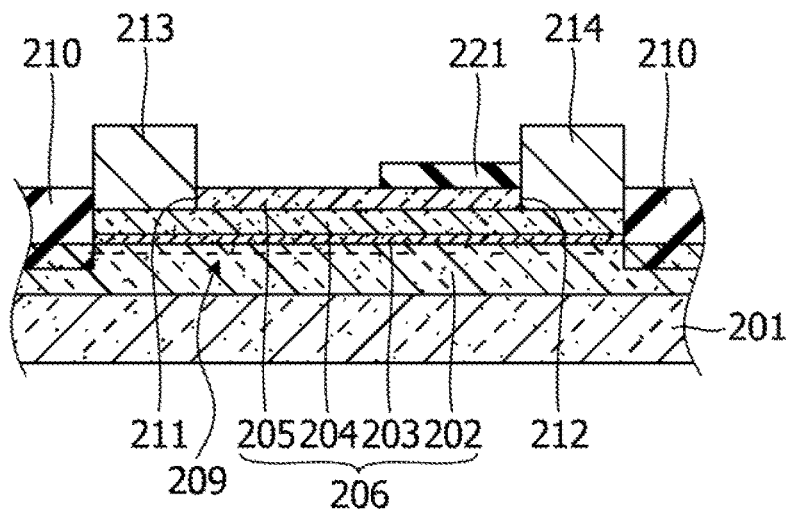
FIGS. 8A to 8C are each a section view of the compound semiconductor device according to the fourth embodiment illustrating a manufacturing method thereof.
Figure 8B:
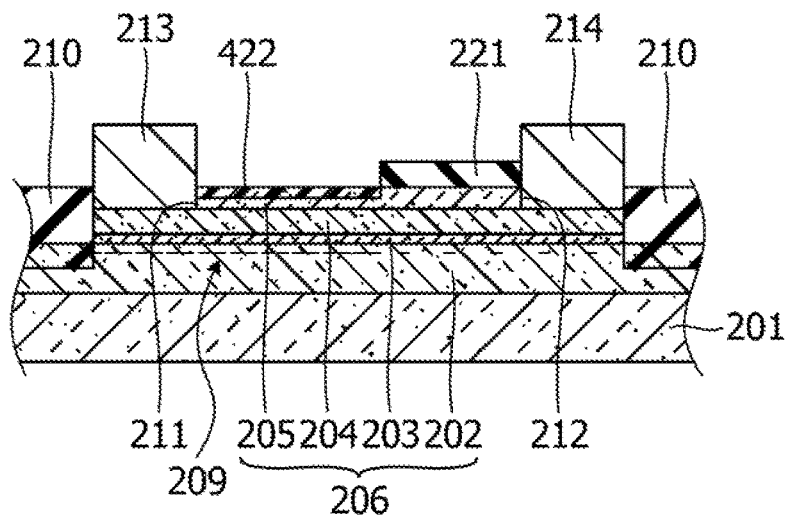
Figure 8C:
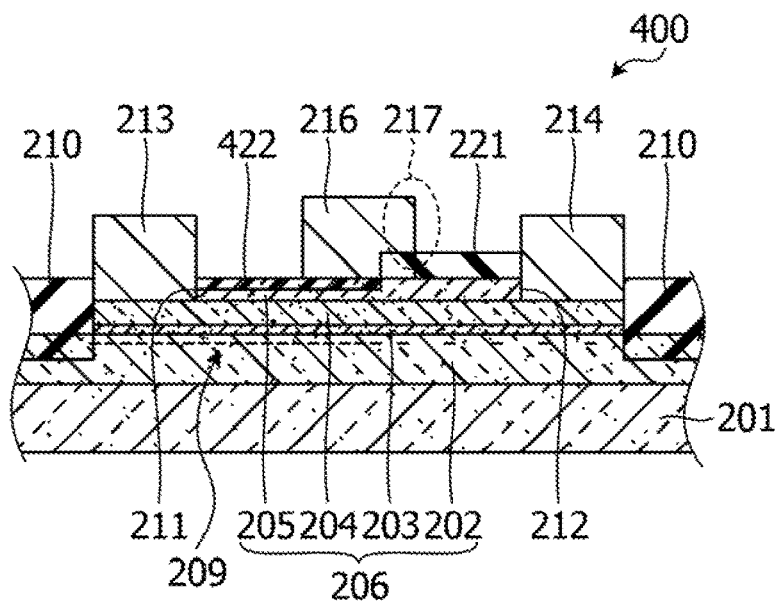

Next, a method for manufacturing the compound semiconductor device 400 according to the fourth embodiment will be described. FIGS. 8A to 8C are each a section view of the compound semiconductor device 400 according to the fourth embodiment illustrating a manufacturing method thereof.

First, as illustrated in FIG. 8A, processing up to the processing of the first insulating layer 221 (FIG. 4E) is performed in a similar manner to the method for manufacturing the compound semiconductor device 200.

Next, as illustrated in FIG. 8B, the second insulating layer 422 is formed on a part of the surface of the cap layer 205 exposed through the first insulating layer 221. In the formation of the second insulating layer 422, for example, a resist film having an opening portion in a region where the second insulating layer 422 is to be formed is provided by photolithography technology, and the surface of the cap layer 205 is oxidized by using water vapor. Oxygen plasma or the like may be used instead of the water vapor.

Then, as illustrated in FIG. 8C, the gate electrode 216 is formed in a similar manner to the method for manufacturing the compound semiconductor device 200.

Then, protective films and wiring are formed if necessary, and thus the compound semiconductor device is completed.

According to this manufacturing method, the second insulating layer 422 may be formed by oxidizing the surface of the cap layer 205. Therefore, the manufacturing time may be shortened as compared with the method for manufacturing the compound semiconductor device 200.

The compositions of compound semiconductor layers included in the semiconductor laminate structure is not limited to those described in the embodiments described above. For example, nitride semiconductors such as InAlN and InGaAlN may be used. In addition, compound semiconductors such as InP may be used.

Figure 9:
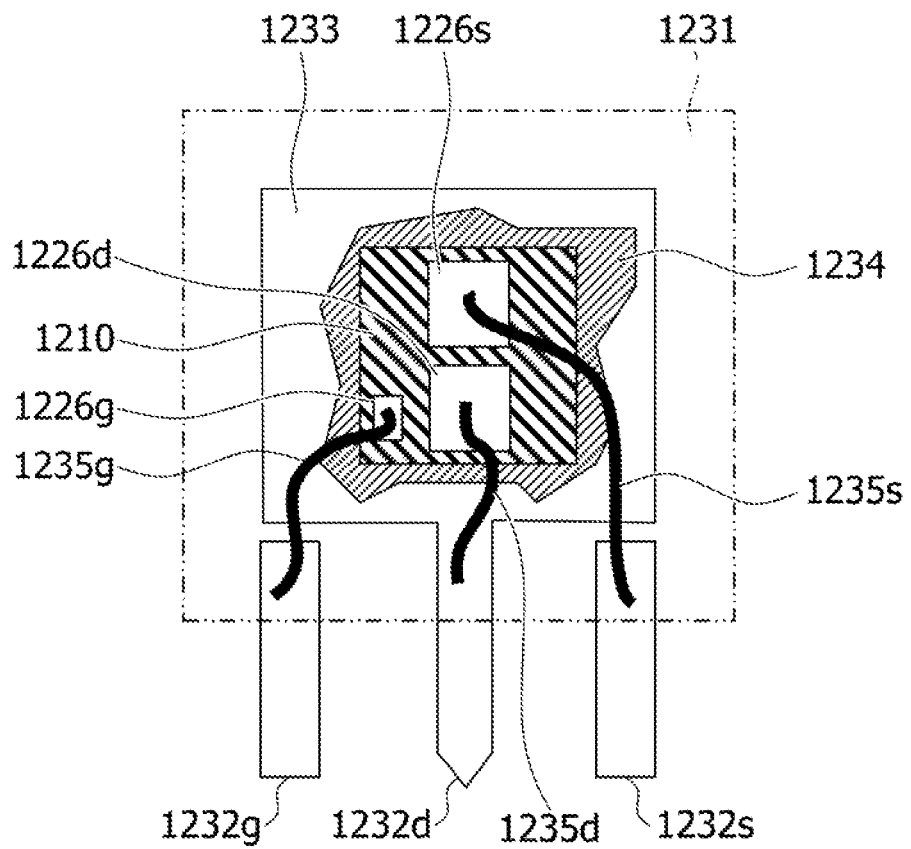
FIG. 9 is a diagram illustrating a discrete package according to a fifth embodiment.

Next, a fifth embodiment will be described. The fifth embodiment relates to a discrete package of an HEMT. FIG. 9 is a connection diagram illustrating a discrete package according to the fifth embodiment.

In the fifth embodiment, as illustrated in FIG. 9, the back side of a compound semiconductor device 1210 having a structure similar to any one of the first to fourth embodiments is fixed to a land (die pad) 1233 by using a die attaching agent 1234 such as solder. A first end of a wire 1235d such as an Al wire is connected to a drain pad 1226d to which the drain electrode 114 or 214 is connected, and a second end of the wire 1235d is connected to a drain lead 1232d integrated with the land 1233. A first end of a wire 1235s such as an Al wire is connected to a source pad 1226s to which the source electrode 113 or 213 is connected, and a second end of the wire 1235s is connected to a source lead 1232s independent from the land 1233. A first end of a wire 1235g such as an Al wire is connected to a gate pad 1226g to which the gate electrode 116 or 216 is connected, and a second end of the wire 1235g is connected to a gate lead 1232g independent from the land 1233. Further, the land 1233, the compound semiconductor device 1210, and so forth are packaged by a mold resin 1231 such that part of the gate lead 1232g, part of the drain lead 1232d, and part of the source lead 1232s project.

For example, such a discrete package may be manufactured as follows. First, the compound semiconductor device 1210 is fixed to the land 1233 of a lead frame by using the die attaching agent 1234 such as solder. Next, via bonding using the wires 1235g, 1235d, and 1235s, the gate pad 1226g is connected to the gate lead 1232g of the lead frame, the drain pad 1226d is connected to the drain lead 1232d of the lead frame, and the source pad 1226s is connected to the source lead 1232s of the lead frame. Then, sealing is performed by a transfer mold method using the mold resin 1231. Subsequently, the lead frame is cut off.

Figure 10:
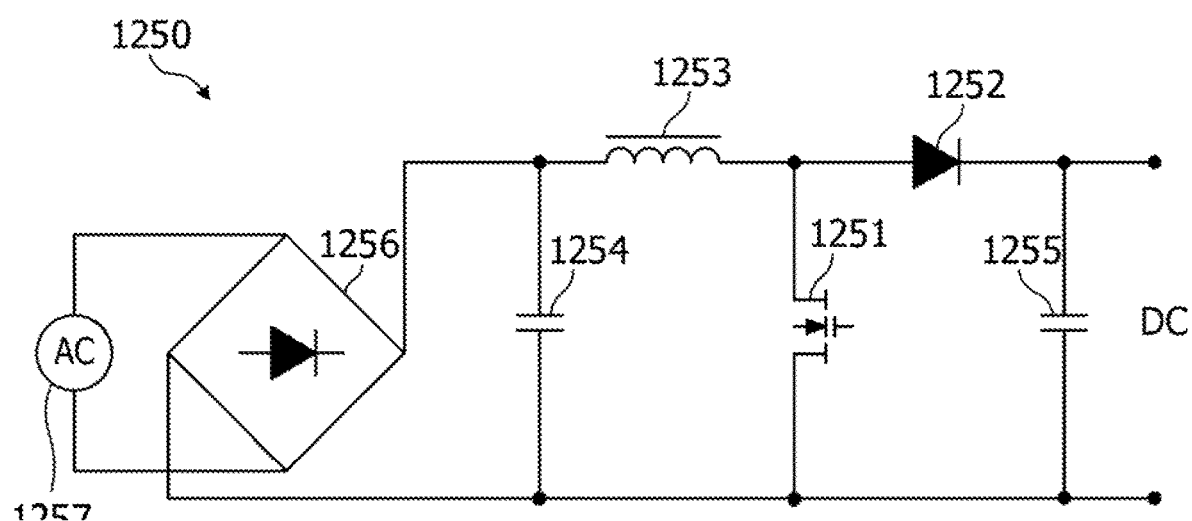
FIG. 10 is a connection diagram illustrating a PFC circuit according to a sixth embodiment.

Next, a sixth embodiment will be described. The sixth embodiment relates to a power factor correction (PFC) circuit including an HEMT. FIG. 10 is a connection diagram illustrating a PFC circuit according to the sixth embodiment.

A PFC circuit 1250 includes a switch element (transistor) 1251, a diode 1252, a choke coil 1253, capacitors 1254 and 1255, a diode bridge 1256, and an alternate current power source (AC) 1257. Further, a drain electrode of the switch element 1251 is connected to an anode terminal of the diode 1252 and a first terminal of the choke coil 1253. A source electrode of the switch element 1251 is connected to a first terminal of the capacitor 1254 and a first terminal of the capacitor 1255. A second terminal of the capacitor 1254 is connected to a second terminal of the choke coil 1253. A second terminal of the capacitor 1255 is connected to a cathode terminal of the diode 1252. A gate driver is connected to a gate electrode of the switch element 1251. The AC 1257 is connected to the first and second terminals of the capacitor 1254 with the diode bridge 1256 therebetween. A direct current power source (DC) is connected to the first and second terminals of the capacitor 1255. In the present embodiment, a compound semiconductor device having a similar structure to any one of the first to fourth embodiments is used as the switch element 1251.

When manufacturing the PFC circuit 1250, for example, the switch element 1251 is connected to the diode 1252, the choke coil 1253, and so forth by using solder.

Figure 11:
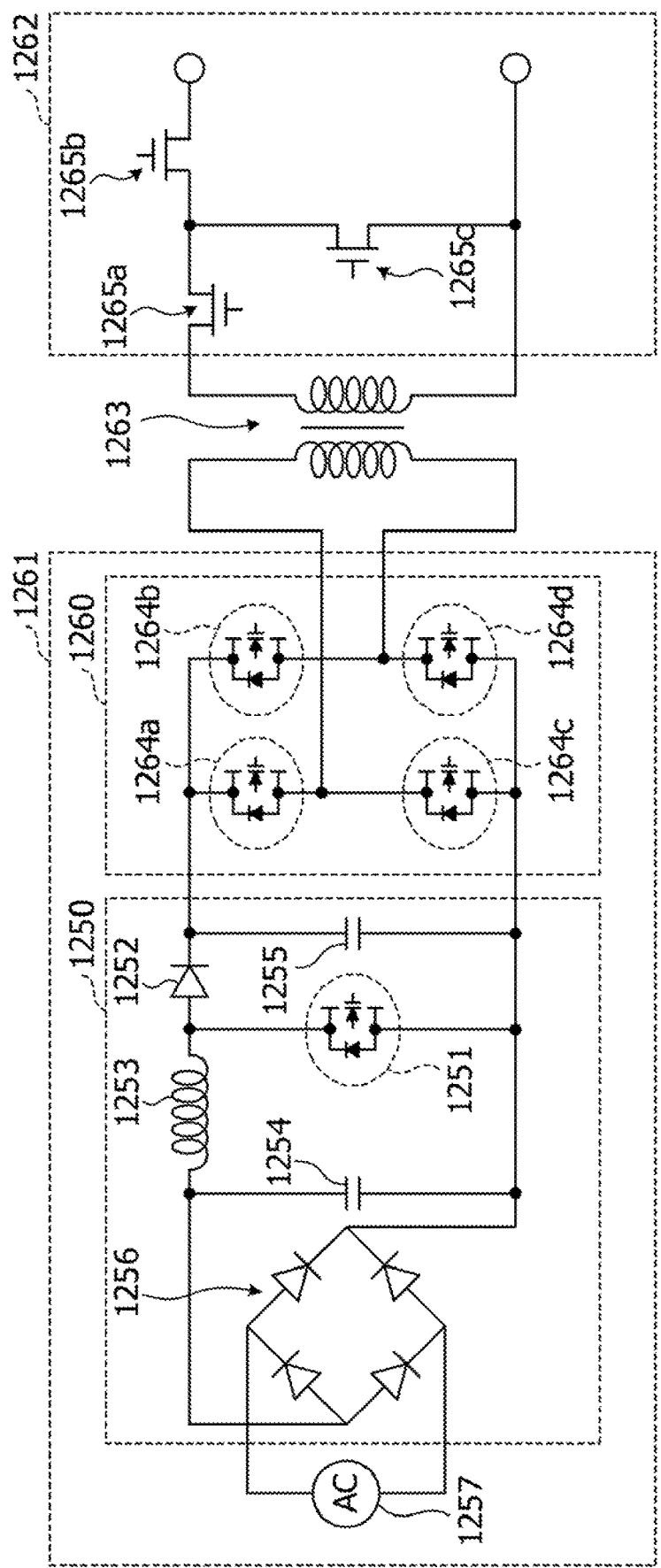
FIG. 11 is a connection diagram illustrating a power source apparatus according to a seventh embodiment.

Next, a seventh embodiment will be described. The seventh embodiment relates to a power source apparatus including an HEMT that is suitable for a server power source. FIG. 11 is a connection diagram illustrating a power source apparatus according to the seventh embodiment.

The power source apparatus includes a primary circuit 1261 of high voltage, a secondary circuit 1262 of low voltage, and a transformer 1263 provided between the primary circuit 1261 and the secondary circuit 1262.

The primary circuit 1261 includes the PFC circuit 1250 according to the sixth embodiment, and an inverter circuit connected to the first and second terminals of the capacitor 1255 of the PFC circuit 1250, for example, a full-bridge inverter circuit 1260. The full-bridge inverter circuit 1260 includes a plurality of (in this case, four) switch elements 1264a, 1264b, 1264c, and 1264d.

The secondary circuit 1262 includes a plurality of (in this case, three) switch elements 1265a, 1265b, and 1265c.

In the present embodiment, compound semiconductor devices having a similar structure to any one of the first to fourth embodiments are used for the switch element 1251 of the PFC circuit 1250 constituting the primary circuit 1261 and the switch elements 1264a, 1264b, 1264c, and 1264d of the full-bridge inverter circuit 1260. In contrast, normal metal-insulator-semiconductor-type field effect transistors (MIS-FETs) formed from silicon are used for the switch elements 1265a, 1265b, and 1265c of the secondary circuit 1262.

Figure 12:
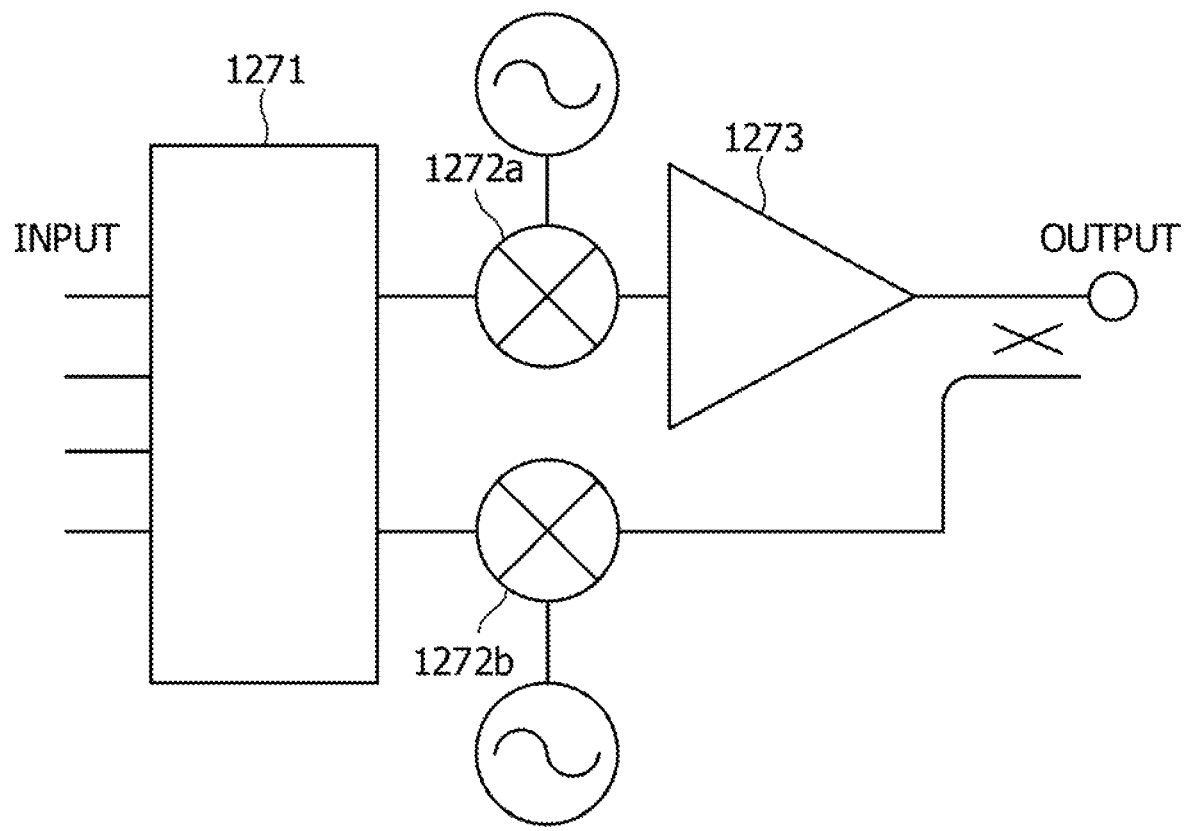
FIG. 12 is a connection diagram illustrating an amplifier according to an eighth embodiment.

Next, an eighth embodiment will be described. The eighth embodiment relates to an amplifier including an HEMT. FIG. 12 is a connection diagram illustrating an amplifier according to the eighth embodiment.

The amplifier includes a digital predistortion circuit 1271, mixers 1272a and 1272b, and a power amplifier 1273.

The digital predistortion circuit 1271 compensates nonlinear distortion of an input signal. The mixer 1272a mixes the input signal whose nonlinear distortion has been compensated with an alternate current signal. The power amplifier 1273 includes a compound semiconductor device having a similar structure to any one of the first to fourth embodiments, and amplifies the input signal mixed with the alternate current signal. In the present embodiment, for example, by switching a switch, an output signal may be mixed with an alternate current signal in the mixer 1272b and transmitted to the digital predistortion circuit 1271. This amplifier may be used as a high-frequency amplifier or a high-output amplifier. The high-frequency amplifier may be used for, for example, a communication apparatus used in a mobile phone base station, a radar apparatus, and a microwave generation apparatus.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising:
a compound semiconductor laminate structure including an electron transit layer and an electron supply layer;
a gate electrode, a source electrode, and a drain electrode that are formed over the electron supply layer;
a first insulating layer of diamond formed between the gate electrode and the drain electrode over the compound semiconductor laminate structure; and
a second insulating layer formed between the gate electrode and the source electrode over the compound semiconductor laminate structure,
wherein a positive compressive stress is applied from the first insulating layer to the electron supply layer, and a compressive stress from the second insulating layer to the electron supply layer is smaller than the compressive stress from the first insulating layer to the electron supply layer.

2. The compound semiconductor device according to claim 1, wherein the second insulating layer applies a positive tensile stress to the electron supply layer.

3. The compound semiconductor device according to claim 1, wherein a lattice constant of the second insulating layer is larger than a lattice constant of the electron supply layer.

4. The compound semiconductor device according to claim 1, wherein the compound semiconductor laminate structure includes a cap layer of nitride semiconductor containing Al above the electron transit layer and the electron supply layer.

5. The compound semiconductor device according to claim 1, wherein the gate electrode includes a field plate portion in contact with a top surface of the first insulating layer.

6. The compound semiconductor device according to claim 1, wherein the second insulating layer is a layer of aluminum oxide or silicon nitride.

7. An amplifier comprising:
a compound semiconductor device including:
a compound semiconductor laminate structure including an electron transit layer and an electron supply layer,
a gate electrode, a source electrode, and a drain electrode that are formed over the electron supply layer,
a first insulating layer of diamond formed between the gate electrode and the drain electrode over the compound semiconductor laminate structure, the first insulating layer applying a positive compressive stress to the electron supply layer, and
a second insulating layer formed between the gate electrode and the source electrode over the compound semiconductor laminate structure, a compressive stress from the second insulating layer to the electron supply layer being smaller than the compressive stress from the first insulating layer to the electron supply layer.

8. A method of manufacturing a compound semiconductor device, the method comprising:
forming a compound semiconductor laminate structure including an electron transit layer and an electron supply layer;
forming a gate electrode, a source electrode, and a drain electrode over the electron supply layer;
forming a first insulating layer of diamond between the gate electrode and the drain electrode over the compound semiconductor laminate structure, wherein a positive compressive stress is applied from the first insulating layer to the electron supply layer; and
forming a second insulating layer between the gate electrode and the source electrode over the compound semiconductor laminate structure, wherein a compressive stress from the second insulating layer to the electron supply layer is smaller than the compressive stress from the first insulating layer to the electron supply layer.

9. The method according to claim 8, wherein the forming the compound semiconductor laminate structure includes forming a cap layer of nitride semiconductor containing Al above the electron transit layer and the electron supply layer.

10. The method according to claim 8, wherein the first insulating layer is formed by a chemical vapor deposition at a temperature of 600° C. to 900° C.

11. The method according to claim 8, wherein the forming of the first insulating layer and the second insulating layer is executed prior to the forming of the gate electrode.

* * * * *